US008721915B2

(12) United States Patent
Cohen et al.

(10) Patent No.: US 8,721,915 B2
(45) Date of Patent: *May 13, 2014

(54) ORDERED OXYNITRIDE PEROVSKITES

(75) Inventors: Ronald Cohen, Silver Spring, MD (US); Razvan Caracas, Lyons (FR)

(73) Assignee: Carnegie Institution of Washington, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/614,074

(22) Filed: Sep. 13, 2012

(65) Prior Publication Data

US 2013/0071312 A1 Mar. 21, 2013

Related U.S. Application Data

(63) Continuation of application No. 12/007,043, filed on Jan. 4, 2008, now Pat. No. 8,287,831.

(60) Provisional application No. 60/879,011, filed on Jan. 8, 2007, provisional application No. 60/878,392, filed on Jan. 4, 2007.

(51) Int. Cl.
 *C01B 21/00* (2006.01)
(52) U.S. Cl.
 USPC ..... 252/62.9 R; 501/153; 501/152; 501/96.1; 423/263; 423/358; 117/944
(58) Field of Classification Search
 USPC ............ 252/62.9 R; 501/153, 152, 154, 96.1; 423/263, 358; 117/944
 See application file for complete search history.

(56) References Cited

U.S. PATENT DOCUMENTS

| 4,734,390 | A | 3/1988 | Marchand et al. |
| 4,964,016 | A | 10/1990 | Marchand et al. |
| 6,383,416 | B1 | 5/2002 | Hamada et al. |
| 6,432,325 | B1 | 8/2002 | Hamada et al. |
| 6,979,623 | B2 | 12/2005 | Rotondaro et al. |
| 8,287,831 | B2 * | 10/2012 | Cohen et al. ................. 423/326 |
| 2004/0135495 | A1 | 7/2004 | Wu et al. |

OTHER PUBLICATIONS

Gunther et al, "Structural Investigations on the Oxidenitrides SrTaO2N, CaTaO2N and LaTaOn2 by Neutron and X-ray Powder Diffraction", Z. Anorg. Chem. 2000, 626, pp. 1519-1525.*
Clark et al, "Oxynitride Perovskites: Synthesis and Structure of LaZrO2N, NdTiO2N and LaTiO2N and Comparison with Oxide Perovskites", Chem. Mater. 2002, 14, pp. 288-294.*
Clark et al., "Structure of Zr2ON2 by Neutron Powder Diffraction: The Absence of Nitride-Oxide Ordering," Journal of Solid State Chemistry, 146:399-405 (1999).

(Continued)

*Primary Examiner* — Carol M Koslow
(74) *Attorney, Agent, or Firm* — Morgan Lewis & Bockius LLP (57) ABSTRACT

This invention relates to partially ordered and ordered oxynitride perovskites of the general formula $ABO_2N$ that are polar insulators. A comprises one or more cations or set of cations that sit in sites derived from the A-site in the perovskite structure. B comprises one or more cations or set of cations that sit in sites derived from the B-site in the perovskite structure. C comprises oxygen, O, with optionally some nitrogen, N, and D comprises N, with optionally some O. The total valence of the cations A+B is equal to the total valence of the anions 2 C+D. Also disclosed are methods of producing such oxynitride perovskites and uses of such oxynitride perovskites.

10 Claims, 4 Drawing Sheets

(56) References Cited

OTHER PUBLICATIONS

Fang et al., "Local structure and electronic properties of BaTaO2N with perovskite-type structure," Journal of Physics and Chemistry of Solids, 64:281-286 (2003).

Gunther et al., "Structural Investigations on the Oxidenitrides SrTaO2N, CaTaO2N and LaTaON2 by Neutron and X-ray Powder Diffraction," Z. Anorg. Allg. Chem., 626:1519-1525 (2000) (English Abstract).

Kim, Young, Thesis entitled "Syntheses, Crystal, Structure and Dielectric Property of Oxynitride Perovskite" Ohio State University, Columbus, OH, 66(6), 3125, p. 123-156 (2005).

Clarke et al., Oxynitride Perovskites: Synthesis and Structures of LaZrO2N, NdTiO2N and LaTiO2N and Comparison with Oxide Perovskites, Chem. Mater. 12: 288-294 (2002).

Grins et al., Synthesis of Oxynitride Perovskites (AZrxTa1-xO2+XN1-X, A = Ca, A, Sr, Ba and 0 < X < 1), Materials Research Bulletin 29(7): 801-809 (1994).

Kim et al., Characterization of Structural, Optical and Dielectric Properties of Oxynitride Perovskites AMO2N (A=Ba, Sr, Ca; M=Ta, Nb), Chem. Mater. 16: 1267-1276 (2004).

Ching et al. "Electronic structure and bonding in the Y-Si-O-N quarternary crystals," Aug. 10, 2004, Physical Review B 70, 085105, pp. 1-14 (2004).

\* cited by examiner

ORDERED OXYNITRIDE PEROVSKITES

CROSS REFERENCE TO RELATED APPLICATIONS

This application is a continuation of application of U.S. Application Ser. No. 12/007,043, filed Jan. 4, 2008, and granted on Oct. 16, 2012, as U.S. Pat. No. 8,287,831, which claims the benefit of U.S. Provisional Application No. 60/879,011, filed Jan. 8, 2007 and U.S. Provisional Application No. 60/878,392 filed Jan. 4, 2007, all of which are herein incorporated by reference in their entireties.

STATEMENT REGARDING FEDERALLY SPONSORED RESEARCH

This invention was made with U.S. government support under grant number NOOO14-97-1-0052 (entitled "First-Principles Calculations of Physical Properties and Bonding in Ferroelectrics") from the Office of Naval Research. The U.S. government has certain rights in the invention.

BACKGROUND OF THE INVENTION

1. Field of the Invention

This invention relates to oxynitride perovskites, and in particular to partially or fully ordered oxynitride perovskites of the general formula $ABO_2N$ that have a high polarization.

2. Description of Related Art

The first perovskite discovered was calcium titanium oxide ($CaTiO_3$). The term "perovskite" is now used to describe a group of oxides that have similar structures to calcium titanium oxide and the general formula of $ABO_3$. The parent, or high-temperature, crystal structure of an $ABO_3$ perovskite is cubic, with an A-cation in the middle of the cube, a B-cation in the corner and the anion, commonly oxygen, in the center of the edges. The structure is stabilized by the six coordination of the B-cation (octahedron) and twelve coordination of the A cation. Thus, packing of the ions is such that the A and O ions together form a cubic close packed array, where the B ions occupy a quarter of the octahedral holes. Differences in ratio between the A and B cations can cause a number of different distortions in the structure, usually consisting of tilting of the octahedra, which leads to centrosymmetric or non-polar structures, or off-centering of the cations, leading to polar structures. Polar perovskite structures have the curious property that the central atom does not "touch" its coordination neighbors, in violation of Pauling's rules.

Perovskites have many uses such as e.g., in ferroelectrics, catalysts, sensors, and superconductors. In particular, perovskite oxides have been of great interest, as they appear to be an alternative to complementary-metal-oxide-semiconductor (C-MOS) gate dielectrics and dynamic random access memory (DRAM) storage capacitors. Many superconductors are based on the perovskite structure.

Given the interesting properties of perovskites, researchers have attempted to synthesize complex perovskites, which are variants of the general structural formula of $ABO_3$. Such complex perovskites may contain two or more different B-site cations. This results in ordered and disordered variants. Most work has centered on variations in the cations, but the anions can also be varied. One of the latter variants gives an oxynitride perovskite, such as e.g., $CaTaO_2N$ or $Na_3WO_3N$.

U.S. Pat. No. 4,734,390 to Marchand et al. discloses non-ordered oxynitride perovskites of the general structure $ABO_{3-n}N_n$. A is a metal from Group IA, Group IIA, yttrium or the lanthanides; B is metal from Groups IVA to IB. In particular, A is selected from the group consisting of $Li^+$, $Na^+$, $K^+$, $Rb^+$, $Cs^+$, $Ag^+$, $Tl^+$, $Ca^{2+}$, $Ba^{2+}$, $Sr^{2+}$, $Pb^{2+}$, $Cd^{2+}$, $Ln^{3+}$, $Bi^{3+}$, $Y^{3+}$, $Th^{4+}$, $U^{4+}$ and trans-$U^{4+}$. B is selected from the group consisting of $W^{6+}$, $Re^{6+}$, $Mo^{6+}$, $Ta^{5+}$, $Nb^{5+}$, $Mo^{5+}$, $W^{5+}$, $Ti^{4+}$, $Zr^{4+}$, $Sn^{4+}$, $Ge^{4+}$, $Nb^{4+}$, $Ta^{4+}$, $Al^{3+}$, $Ga^{3+}$, $In^{3+}$, $Tl^{3+}$, $Fe^{3+}$, and $Cr^{3+}$. Furthermore, n is equal to 1, 2, or 3. The cationic charge a of metal A and the cationic charge b of metal B have to satisfy the equations (i) a+b=6+n and (ii) a≥n. These oxynitride perovskites are synthesized via ammoniazation and sintering, which must be carried out at high temperature. This process, however, does not yield ordered, or even partially ordered, oxynitride perovskites.

In addition, Marchand et al. reportedly also prepared $ATaO_2N$ (A=Ca, Sr, Ba), $AbNbO_2N$ (A=Sr, Ba), $AMON_2$ (A=La, Dy; M=Nb, Ta), $ATiO_2N$ (A=La, Yb) and $LnWO_xN_{3-x}$ (Ln=La, Nd) (Grins et al. Material Research Bulletin 29(7): 801-809 (1994)).

U.S. Pat. No. 6,383,416 (the '416 patent) to Hamada et al. is directed to an electron-emitting material containing perovskite oxynitrides of the general formula $M^IM^{II}O_2N$ and other components. U.S. Pat. No. 6,432,325 (the '325 patent) also to Hamada et al. (and filed on the same day as the '416 patent) discloses electrodes comprising electron-emitting materials, which contain $M^IM^{II}O_2N$ type oxynitride perovskites and have restrained evaporation during electric discharge as well as a high resistance to ion sputtering.

The '416 patent and the '325 patent disclose identical electron emitting materials containing $M^IM^{II}O_2N$ type oxynitride perovskites with identical components. As disclosed in both the '416 and the '325 patent, the electron-emitting material may also contain tantalum, zirconium, niobium, titanium, hafnium, and mixtures thereof. In addition, the material may also contain compounds of general formula $M^I_4M^{II}O_3$, $M^I_5M^{II}_4O_{15}$, $M^I_7M^{II}_6O_{22}$, and $M^I_6M^{II}M^{II}_4O_{18}$. $M^I$ is selected from barium (Ba), strontium (Sr) and calcium (Ca). $M^{II}$ is selected from tantalum (Ta), zirconium (Zr), niobium (Nb), titanium (Ti), and hafnium (Hf). In addition, the electron emitting material may contain magnesium (Mg), scandium (Sc), yttrium (Y), lanthanum (La), vanadium (V), chromium (Cr), molybdenum (Mo), tungsten (W), iron (Fe), nickel (Ni), or aluminum (Al). Preferably, this electron emitting material satisfies the equation 0.8≤X/Y≤1.5, wherein X and Y are the molar ratios of the first and second component ($M^I$ and $M^{II}$), respectively. In the case of '416 patent, a range of 0.9≤X/Y≤1.2 is even more preferred. These compounds are produced by sintering and they are not ordered.

Clarke et al. (Chem. Mater. 14: 288-294 (2002)) and Kim et al. (Chem. Mater. 16: 1267-1276 (2004)) synthesized other oxynitride perovskites of the general formula $M^{III}M^{IV}O_2N$.

None of these oxynitride perovskites has an ordered or a partially ordered structure; they all have disordered structures, and centrosymmetric space groups. Since these compounds are non-polar, they cannot be used as ferroelectrics, piezoelectrics, non-linear optics, or other polar applications.

There is a need for partially ordered and ordered oxynitride perovskites that advantageously exploit the perovskite structure or a variant thereof for practical application.

SUMMARY

The present invention relates to novel partially or fully ordered oxynitride perovskites of general structure $ABC_2D$.

A comprises one or more cations or set of cations that sit in sites derived from the A-site in the perovskite structure. B comprises one or more cations or set of cations that sit in sites derived from the B-site in the perovskite structure. C comprises oxygen, O, with possibly some nitrogen, N, and D comprises N, with possibly some O. The total valence of the cations A+B is equal to the total valence of the anions 2 C+D. In some embodiments, C is mostly oxygen, O, with possibly some nitrogen, N. In other embodiments, D is mostly N, with possibly some O.

In one embodiment of the invention, when A is (i) a trivalent cation or cationic group, (ii) a solid solution of trivalent cations or cationic groups, or (iii) a solid solution of heterovalent cations or cationic groups with positive trivalent average charge, B is (i) a tetravalent cation, (ii) a solid solution of tetravalent cations, or (iii) a solid solution of heterovalent cations with positive tetravalent average. In that embodiment, C is (i) oxygen, (ii) an oxygen-dominant solid solution of divalent anions, or (iii) an oxygen-dominant solid solution of heterovalent cations with negative divalent average charge and D is (i) nitrogen, (ii) a nitrogen-dominant solid solution of trivalent anions, or (iii) a nitrogen-dominant solid solution of heterovalent anions with negative trivalent average charge.

The oxynitride perovskites of interest may be ordered or partially ordered and are polar and non-metallic. In one embodiment, the total valence of the cations A+B may be seven.

Oxynitride perovskites according to the instant disclosure have a large polarity. In one embodiment, the polarity of an oxynitride perovskite is more than 75 $\mu C/cm^2$ or even more than about 100 $\mu C/cm^2$, more than that of $PbTiO_3$.

In one embodiment, A is selected from the group consisting of bismuth, indium, and gallium; B is selected from the group consisting of titanium, zirconium, silicon, tin, and germanium; C is oxygen and D is nitrogen. In another of the embodiment of the invention, A is yttrium and B is selected from the group consisting of titanium, zirconium, silicon, tin and germanium. Exemplary oxynitride perovskites include $YSiO_2N$, $YGeO_2N$, $GaTiO_2N$, $InTiO_2N$, $BiZrO_2N$, $YCO_2N$, $BiTiO_2N$, $YTiO_2N$, $YZrO_2N$, and $YSnO_2N$. In preferred embodiments, the oxynitride perovskites are $YSiO_2N$, $YGeO_2N$ and $InTiO_2N$.

In an embodiment of the invention, the oxynitride perovskite is dielectric. In an embodiment of the invention, the oxynitride perovskite is ferroelectric.

These ordered, or even partially ordered, oxynitride perovskites may be used in compositions, as crystals and in compositions containing these crystals. One embodiment of the invention is a non-linear optic material containing a partially ordered oxynitride perovskite. In another embodiment, a partially ordered or ordered oxynitride perovskite is used as part of neutron or hard-X-ray generators.

The invention is also directed to methods of producing a partially ordered or ordered oxynitride perovskite. In one embodiment of the invention, molecular beam epitaxy is used to produce oxynitride perovskites of the instant disclosure. In another embodiment, the oxynitrides are grown from a melt under confining pressure. In another embodiment, the oxynitrides are grown from solid state synthesis from YN and $SiO_2$ glass. In another embodiment, the perovskite oxynitrides are grown by subjecting pyroxenoid oxynitride precursors to high pressure.

Applicants note that many of the features of their invention are also discussed in their paper, *Prediction of polar ordered oxynitride perovskites*, Razvan Caracas and R. E. Cohen, Applied Physics Letters 91 092902 (published online Aug. 27, 2007), which published well after the priority date of the present application.

Additional features and advantages of the invention will be set forth in the description that follows, and will be apparent, in part, from the description, or may be learned by practice of the invention. The objectives and other advantages of the invention will be realized and attained by the structure particularly pointed out in the written description and claims hereof, as well as the appended drawings.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention.

FIG. 2 shows the phonon dispersion curves for $YGeO_2N$ and $YSiO_2N$. $YGeO_2N$ is shown in FIG. 2 A and $YSiO_2N$ in FIG. 2 B. The positive phonon frequencies prove the (meta) stability of the structure.

FIG. 4 shows the polarization of $YGeO_2N$ (FIG. 4 A) and $YSiO_2N$ (FIG. 4 B) versus polar distortion.

DETAILED DESCRIPTION OF THE INVENTION

The present invention is directed to a new class of ordered and partially ordered oxynitride perovskites and perovskite-related oxynitrides with stable structures that present interesting piezoelectric properties.

The invention is based on first-principles calculations of the structures and physical properties of a new class of perovskite-related oxynitrides with polar structures. These structures have large spontaneous polarizations (larger than those of materials currently in use), large piezoelectric constants, and large non-linear optical coefficients.

The present invention is the result of an extensive search for new piezoelectric materials. Due to their properties, these new materials could successfully be used in devices including, but not limited to, non-linear optics (e.g., frequency doublers and shifters), optical relays, electrooptics (optical to electrical coupling), piezoelectric sensors, actuators, frequency standards, piezoelectric motors, ultrasonic transducers, vibration reducers, ferroelectric memory, ferroelectric gate transistors, piezoelectric voltage transformers, neutron generators, and X-ray generators.

As used herein, the term "solid solution" means a crystalline solid with variable composition; one or more crystallographic sites contains multiple elements.

As used herein, the term "ordered" means that elements are distributed in a definite pattern among the crystallographic sites. A classic, non-limiting, example is β-brass, which consists of Cu atoms at the corners of a cube with Zn in the center (CsCl or B2 structure). Disordered brass has an arrangement of Cu and Zn atoms with equal probabilities of Cu and Zn on each site, giving the average body centered cubic or bcc structure.

As used herein, the term "partially ordered" means that the atoms are not distributed completely randomly in a crystallographic site, but are somewhere between fully ordered and fully disordered. In the brass example, the Zn site would contain some Cu and the Cu site some Zn.

As used herein, the term "dielectric" means an insulator. A dielectric does not display metallic conduction and can maintain at least a small voltage differential without significant current flow except for leakage current, which is due to defects.

The present invention is directed to ordered and partially ordered oxynitride perovskites. In particular, the present invention is directed to ordered and partially ordered oxynitride perovskites of the formula:

$$ABC_2D,$$

wherein

A comprises one or more cations or set of cations that sit in sites derived from the A-site in the perovskite structure. B comprises one or more cations or set of cations that sit in sites derived from the B-site in the perovskite structure. C comprises oxygen, O, with possibly some nitrogen, N, and D comprises N, with possibly some O. The total valence of the cations A+B is equal to the total valence of the anions 2 C+D. In some embodiments, C is mostly oxygen, O, with possibly some nitrogen, N. In other embodiments, D is mostly N, with possibly some O.

The total valence of the cations A+B is equal to the total valence of the anions 2 C+D. In one embodiment of the invention, the total valence of the cations A+B may be seven. The oxynitride perovskites of interest may be ordered or partially ordered and are polar and non-metallic.

In one embodiment, when A is a trivalent cation or cationic group, a solid solution of trivalent cations or cationic groups, or a solid solution of heterovalent cations or cationic groups with positive trivalent average charge, B is tetravalent cation, a solid solution of tetravalent cations, or a solid solution of heterovalent cations with positive tetravalent average. C is oxygen, an oxygen-dominant solid solution of divalent anions, or an oxygen-dominant solid solution of heterovalent cations with negative divalent average charge. D is nitrogen, a nitrogen-dominant solid solution of trivalent anions, or a nitrogen-dominant solid solution of heterovalent anions with negative trivalent average charge.

The oxynitride perovskites according to the instant disclosure are polar dielectrics and as such are insulators.

In another embodiment of the invention, A may be selected from a variety of metals, including metals from Group III. For example, A may be selected from the group consisting of bismuth, indium, yttrium, and gallium. In that embodiment of the invention, B may also be selected from a variety of suitable metals including metals from Group I. For example, B may be selected from titanium, zirconium, silicon, tin, and germanium.

In one embodiment of the invention, A is yttrium and B is silicon. In another embodiment of the invention, A is yttrium and B is germanium. In yet another embodiment of the invention A is indium and B is titanium. Other exemplary oxynitride perovskites include but are not limited to $GaTiO_2N$, $BiZrO_2N$, $YCO_2N$, $BiTiO_2N$, $YTiO_2N$, $YZrO_2N$, and $YSnO_2N$.

Oxynitride perovskites according to the instant disclosure are ordered or partially ordered. The O and N ordering is consistent with the primitive cell symmetry, so the structure has no fundamental superlattice lines relating to the O and N, although a superimposed superlattice structure that does not destroy the polar symmetry is also consistent with the invention.

One of the distinguishing features of oxynitride perovskites according to the instant disclosure is that the perovskites have an extremely large polarity, larger than what is known in the art. For example, $LiNbO_3$ has a polarization of 71 $\mu C/cm^2$, and $LiTaO_3$ has a polarization of 50 $\mu C/cm^2$. The largest known polarization is 75 $\mu C/cm^2$ for $PbTiO_3$. Preferably, oxynitride perovskites according to the instant invention have a polarization of more than 75 $\mu C/CM^2$. The polarization may be from about 75 to about 100 $\mu C/cm^2$ or from about 76 to about 125 $\mu C/cm^2$, from about 100 to about 130 $\mu C/cm^2$ or greater than 100 $\mu C/cm^2$. The spontaneous polarization as obtained from Berry phase calculations is 130 $\mu C/cm^2$ for $YSiO_2N$, 103 $\mu C/cm^2$ for $YGeO_2N$ and 79 $\mu C/cm^2$ for $InTiO_2N$.

Oxynitride perovskites according to the instant disclosure are also stable. The oxynitride perovskites are stable in air and water.

In addition, oxynitride perovskites according to the instant invention may have but are not limited to tetragonal symmetry with a P4 mm space group with five (5) atoms per primitive cell. Alternatively, oxynitride perovskites according to the instant invention may have monoclinic symmetry with a Pm space group. Symmetry related structures are obtained by allowing for rotations of the coordination polyhedra and/or cation displacements. Symmetry group/subgroup relations can relate all these structures.

The structure of these materials is obtained from the perovskite structure by replacing in each unit cell one oxygen atom by one nitrogen atom, with a concomitant change in the cations to maintain charge balance. The resulting structure is ordered, polar, piezoelectric, as well as dynamically stable, and at least thermodynamically metastable. A partially ordered structure with some O on the N site and some N or the O site will also display a net polarization with non-linear optical and piezoelectric properties.

The physical basis of the piezoelectricity in these oxynitride perovskites is as follows. The strong covalent boding between the tetravalent cations and the nitrogen atoms and between the trivalent cations and the oxygen atoms induce large anomalous Born effective charges and large displacements of the cations away from the center of mass of the coordination polyhedra. The cation displacements break the symmetry, removing the center of symmetry, and generate large spontaneous polarization and inducing interesting piezoelectric and optical properties. As all cations have large displacement and contribute to the spontaneous polarization, the value of this latter property is very large.

In one embodiment of the invention, the oxynitride perovskite is $YSiO_2N$. In another embodiment of the invention, the oxynitride perovskite is $YGeO_2N$. In another embodiment, the oxynitride perovskite is $GaTiO_2$. In an alternate embodiment, the oxynitride perovskite is $InTiO_2N$. In yet another embodiment, the oxynitride perovskite is $BiZrO_2N$. In another embodiment, the oxynitride perovskite is $YCO_2N$. In another embodiment, the oxynitride perovskite is $GaTiO_2N$.

Synthesis

Previously, non-polar, disordered, oxynitride perovskites were synthesized by firing of metal oxides and carbonates with flowing ammonia at elevated temperatures. Thus, the conventional synthesis can be described by the following equation:

$$ABO_x + NH_3 \rightarrow ABO_yN_z + H_2O$$

Such a reaction typically involves sintering of the reactants. Perovskite oxides produced by this conventional synthesis approach have been shown to exhibit large dielectric constants, but much smaller than oxynitride perovskites of the instant application. They are also disordered and centrosymmetic with three-dimensional arrangement such as I4/mcm and Pbnm. Thus, these oxynitride perovskites are not piezoelectric.

Synthesis of an oxynitride perovskite according to the instant disclosure would not proceed via use of the currently known methods for producing oxynitrides. Using such a conventional synthesis approach to produce oxynitride perovskites will not produce ordered replacement of O by N, and thus would not achieve the high polarization exhibited by oxynitride perovskites of the instant disclosure. The use of sintering produces a disordered structure. Thus, the conventional synthesis cannot achieve production of an oxynitride perovskite, which is ordered, or even partially ordered, and a dielectric.

Production of oxynitride perovskites according to the present invention could be achieved using metal nitrides and oxides as precursors. An example of such a reaction would be:

Or

Both YN and $SiO_2$ or InN and $TiO_2$ are readily available reagents.

This synthesis reaction may be carried out under higher pressure and temperature. Synthesis pressures may be as low as 1-10 GPa, and temperatures of 1000-2000K. Such higher temperature and pressure would be particularly advantageous to provide extra energy necessary to accelerate the kinetics of the ordering of the perovskite structure. In one embodiment of the invention, pressure could be produced via shock or static conditions. At the higher temperatures, the crystals can be grown from a melt. In another embodiment crystals are grown from a melt at zero pressure is a controlled atmosphere.

The oxynitride perovskites may be produced utilizing molecular beam epitaxy (MBE) (see S. A. Chambers, Surface Science Reports 39 (5), 105-180 (2000)). In MBE, ultra pure reactants are heated separately until they slowly begin to evaporate. The reactants are then deposited on top of each other as they condense onto an inert substrate such as a wafer. The process takes place under high vacuum or ultra high vacuum. The evaporated reactants do not interact with each other or any other vacuum chamber gases until they reach the wafer, due to the large mean free path lengths of the beams. MBE allows for a slow deposition rate, laying down one atom at a time, to obtain an ordered or partially ordered oxynitride perovskite. For example, ultra-pure elements such as e.g., solid Y, Si, and gaseous $O_2$, gallium and arsenic are heated until they each slowly begin to evaporate, and are combined with oxygen gas.

In alternative synthesis paths, the reaction is carried out via chemical vapor deposition (CVD) or by use of pulsed laser deposition.

Exemplary Uses

Oxynitride perovskites according to the instant invention have many uses. They may be used in compositions containing one or more oxynitride perovskite crystals. Alternatively, oxynitride perovskites may be used as films. For example, an oxynitride perovskite layer may be deposited on a substrate.

In one embodiment, the oxynitride perovskites are used as non-linear optic materials. Such materials are used as e.g., frequency doublers, optical switches, and optical logic elements. In another embodiment of the invention, the optical properties would also be tunable by applying a bias electric field. This would be useful in controlling optical systems.

In another embodiment, the oxynitride perovskites are used to produce high energy x-rays, or neutrons, electrons, or plasma via the pyroelectric effect generating large voltages at their polar surfaces. For example, a crystal of an oxynitride perovskite may be used with deuterium to produce neutrons under appropriate conditions (see B. Naranjo, J. K. Gimzewski, and S. Putterman, Nature 434 (7037), 1115-1117 (2005)). The large polarization can be used along with the pyroelectric effect to accelerate deuterium ions with sufficient energy to undergo fusion and generate neutrons (see D. Yarmolich, V. Vekselman, H. Sagi et al., Plasma Devices and Operations 14 (4), 293-302 (2006)).

Alternatively, the oxynitride perovskite may be used for capacitors, resonators, ferroelectric random-access memories, and switches. Thus, the dielectric perovskite oxynitride according to the instant disclosure may be used as a gate insulating film of a MIS transistor, a capacitor dielectric film of a DRAM, a ferroelectric film such as e.g., a data holding film in a FeRAM, or a transistor such as a MFIS transistor.

EXAMPLES

Non-limiting illustrative examples of embodiments of the present invention follow. These examples are not intended to limit the scope of any embodiment of the present invention, but rather are intended to illustrate features of partially ordered oxynitride perovskites.

Different chemical compositions were explored to find thermodynamically stable structures with interesting piezoelectric properties. Calculations were performed on several oxynitride perovskites including $BiTiO_2N$, $GaTiO_2N$, $InTiO_2N$, $YTiO_2N$, $BiZrO_2N$, $YZrO_2N$, $YGeO_2N$, $YSiO_2N$, $YCO_2N$, and $YSnO_2N$. Different structures are predicted to exist, all of which can be derived from the perovskite structure by allowing for rotation of the coordination polyhedra and/or cation displacements. Symmetry group/subgroup relations can relate all these structures. The resulting structures are dynamically stable, polar, and piezoelectric.

As a matter of example, the results of calculations on some of these compounds follow. The method used for these calculations, the density functional theory (DFT) as implemented in the ABINIT using planewaves and pseudopotentials, was successfully tested on a variety of materials including polar perovskites. The methods included first-principles calculations of the local density approximation (LDA) of density functional theory. The method also employed Troullier-Martins pseudopotentials within a 40 Ha kinetic energy cut-off. Dynamical properties and higher-order non-linear dielectric properties were determined using the density functional perturbation theory and spontaneous polarization using the Berry phase approach. For all these materials (as listed below), the theoretical experiments are within the standard DFT error bar.

A. Crystal Structure

Figure 1:
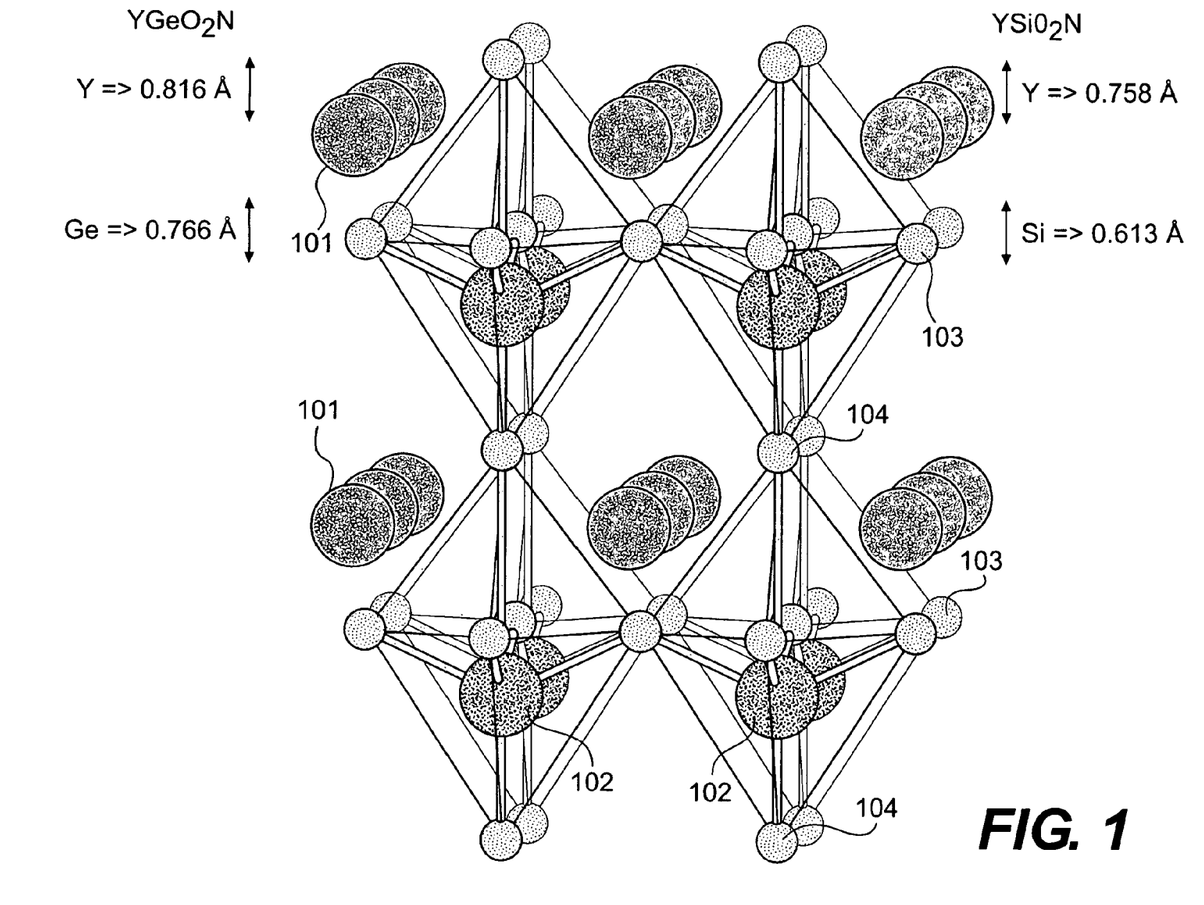
FIG. 1 shows a crystal structure of oxynitride perovskites (e.g., $YGeO_2N$ and $YSiO_2N$) according to the instant invention.

FIG. 1 exemplifies the crystal structure of some oxynitride perovskites according to the instant disclosure. Structures of ordered tetragonal modifications, e.g., of $YGeO_2N$ and $YSiO_2N$ were computed using first-principles calculations. For reference, Y is indicated is by 101, Si/Ge by 102, O by 103 and N by 104. FIG. 1 also includes the cation displacements relative to the centrosymetric structure of (1) Y and Ge in $YGeO_2N$ and (2) Y and Si and $YSiO_2N$. FIG. 1 also shows the displacements of the actions from the ideal positions in the centrosymmetric structure. These large displacements lead to large spontaneous polarization.

The structure of oxynitride perovskites (as shown in FIG. 1) was determined as follows. Starting with an $ABO_3$ cubic simple ordered perovskite with Pm3 m symmetry, one oxygen atom was replaced with a nitrogen atom and the bivalent cation with a trivalent cation. These replacements generate a P4 mm structure for $ABO_2N$ chemistry. Octahedral tilts of the $BO_4N_2$ octahedra around the 4-fold axis doubles the cell: P4 bm symmetry. Unstable phonon mode in the zone-center of the P4 mm and P4 bm structure distorts the structure to monoclinic symmetry Pm.

Overall, the structure of oxynitride perovskite according to one embodiment of the invention, as shown in FIG. 1, has tetragonal symmetry with a P4 mm space group. For $YGeO_2N$ and $YSiO_2N$, the atoms in this structure lie as follows: Y on 1 b (½ ½ z), Si/Ge on 1 a (0 0 z'), O on 2 c (∕1;20 z") and N on 1a (0 0 z''') Wyckoff sites.

The cation displacements relative to the centrosymetric structure are also shown. For $YGeO_2N$, the cation displacement for Y and Ge are 0.816 Å and 0.766 Å, respectively. For $YSiO_2N$, the cation displacement for Y and Ge are 0.758 Å and 0.613 Å, respectively. The depth of the potential well is −0.135 Ha per $YGeO_2N$ molecule. These large structural displacements enhance the polar character of the structure but also deepen the potential wells. Table 1 below lists the relevant parameters.

TABLE 1

Some Structural Parameters for $YSiO_2N$ and $YGeO_2N$.

| Compound | a | c | $Z_Y$ | $Z_{Ge/Si}$ | $Z_O$ | $Z_N$ |
|---|---|---|---|---|---|---|
| $YSiO_2N$ | 3.228 | 4.435 | 0.342 | 0.889 | 0.027 | 0.513 |
| $YGeO_2N$ | 3.307 | 4.66 | 0.325 | 0.874 | 0.038 | 0.500 |

Y lays in 1b (½, ½ z), Ge/Si lay in 1a (0 0 z), O in 2c (½ 0 z) and N in 1a (0 0 z') Wyckoff positions

B. Properties

Oxynitride perovskites according to the instant disclosure have many interesting properties. Tables that list some of these properties for $YGeO_2N$ and $YSiO_2N$ follow below. All values should be considered to have a confidence bar of about ±20%. Table 2 below lists some computed properties of $YGeO_2N$ and $YSiO_2N$. Both $YGeO_2N$ and $YSiO_2N$ have similar values for dielectric tensor $\epsilon^\infty$. However, the values for the dielectric tensor $\epsilon^0$ vary. For $YGeO_2N$, the piezoelectric constants tensor d (pC/N), which describe the magnitude of the induced polarization due to mechanical strain, are $d_{121}$=−20.5, pC/N, $d_{333}$=−5.5 pC/N, and $d_{113}$=−0.5 pC/N. For $YSiO_2N$, the piezoelectric constants tensor d are $d_{121}$=−12.5 pC/N, $d_{333}$=−8.3 pC/N, and $d_{113}$=0.4 pC/N. By way of comparison, $BaTiO_3$ ceramics have a $d_{333}$ of 350, KPD has a $d_{333}$ of 21, and ADP has a $d_{333}$ of 48.

The non-linear optical coefficients d (pm/V) are coefficients of the square terms in the polynomial expansion that relates the polarization induced by an applied electric field. The non-linear optical coefficients d (pm/V) are as follows. For $YGeO_2N$, $d_{15}$=2.6 pm/V and $d_{33}$=−4.5 pm/V. For $YSiO_2N$, $d_{15}$=2.0 pm/V and $d_{33}$=−5.5 pm/V. For comparison, for the organic compound AANP, $d_{31}$=$d_{15}$=80 pm/V, for KDP the coefficients are approximately 0.6-0.7 pm/V and for ADP on the order of 0.8 pm/V.

The electro-optic tensor is a measurement of the change in refractive index due to an applied electric field. The values for the electro-optic tensor for $YGeO_2N$ are $c_{15}$=−0.84 pm/V, $c_{33}$=1.0 pm/V, and $c_{51}$=−1.8 pm/V. For $YSiO_2N$, the values electro-optic tensor values are $c_{15}$=−1.4 pm/V, $c_{33}$=0.64 pm/V, and $c_{51}$=−1.3 pm/V.

TABLE 2

Selected Properties of $YGeO_2N$ and $YSiO_2N$

| | $YGeO_2N$ | | | $YSiO_2N$ | | |
|---|---|---|---|---|---|---|
| Electronic dielectric tensor - $\epsilon^\infty$ | 4.6 | 4 | 5.0 | 4.4 | 4.4 | 4.5 |
| Dielectric tensor - $\epsilon^0$ | 16.1 | 16.1 | 9.8 | 13.4 | 13.4 | 9.7 |
| Predicted Spontaneous polarization, $P_s$ | 103 µC/cm² | | | 130 µC/cm² | | |
| Piezoelectric constants tensor d (pC/N) | $d_{121}$ = −20.5 | | | $d_{121}$ = −12.5 | | |
| | $d_{333}$ = −5.5 | | | $d_{333}$ = −8.3 | | |
| | $d_{113}$ = −0.5 | | | $d_{113}$ = 0.4 | | |
| Non-linear optical coefficients d (pm/V) | $d_{15}$ = 2.6 | | | $d_{15}$ = 2.0 | | |
| | $d_{33}$ = −4.5 | | | $d_{33}$ = −5.5 | | |
| Electro-optic tensor (pm/V) | $c_{15}$ = −0.84 | | | $c_{15}$ = −1.42 | | |
| | $c_{33}$ = 1.05 | | | $c_{33}$ = 0.63 | | |
| | $c_{51}$ = −1.77 | | | $c_{51}$ = −1.32 | | |

Because of the high symmetry of the atomic positions, the Born Effective Charge (BEC) tensors, defined as the change in polarization due to atomic displacements under zero-electric field, are diagonal. The values are listed below in Table 3. The BEC appear to be slightly anomalous, because there are not enough d electrons in the structure from the cations to couple with the p electrons of the anions. This suggests that assuming ordered phases and given the proper ratio between the cation radii to stabilize the high-symmetry P4 mm structure, the introduction of transition metals with more d electrons might result in larger anomalies for the BEC and thus in an enhancement of the polarization. For determinations of spontaneous polarization, the contribution of each atom to the polarization, the dipole, is calculated as the product between the BEC and the position difference between the centrosymmetric and the polar structures. Using Berry phase theories to calculate the spontaneous polarization $P_s$, the values of $P_s$ for $YGeO_2N$ and $YSiO_2N$ are approximately 103 µC/cm² and 130 µC/cm², respectively. Based on the classical (dipole summation) theory, the values of $P_s$ for $YGeO_2N$ and $YSiO_2N$ are approximately 170 µC/cm² and 184 µC/cm², respectively.

TABLE 3

Born effective charge tensors, $Z^*_{ij}$ and corresponding dipole contributions to polarizations in $YGeO_2N$ and $YSiO_2N$

| Element | $Z^*_{11}$ | $Z^*_{22}$ | $Z^*_{33}$ | dipole |
|---|---|---|---|---|
| | $YGeO_2N$ | | | |
| Y | 3.481 | 3.481 | 3.379 | 5.206 |
| Ge | 3.582 | 3.582 | 3.842 | 4.278 |
| O | −2.744 | −1.915 | −2.341 | 0.782 |
| N | −2.404 | −2.404 | −2.539 | 0.001 |
| | $YSiO_2N$ | | | |
| Y | 3.475 | 3.475 | 3.216 | 4.250 |
| Si | 3.491 | 3.491 | 3.988 | 3.717 |
| O | −2.661 | −1.836 | −2.224 | 0.505 |
| N | −2.469 | −2.469 | −2.755 | 0.306 |

Due to symmetry $Z^*_{ij}$ = 0 for ij.

The values for spontaneous polarization ($P_s$) for $YGeO_2N$ and $YSiO_2N$ are compared to those of other compounds including perovskites in Table 4. As can be seen from Table 4, $YGeO_2N$ and $YSiO_2N$ have larger spontaneous polarization values ($P_s$) than those for any of the other listed perovskites. The $P_s$ values for these perovskite are significantly larger than what is currently used. The values obtained for the polarization are the highest values ever reported for a polar solid. For comparison, the polarization in $PbTiO_3$ is about 75 µC/cm², in $LiNbO_3$, it is only 71 µC/cm², and in $LiTaO_3$, it is only about 50 μC/cm². It should be noted that the $P_s$ of 75 μC/cm² for PbTiO$_3$ is thought to be the highest known.

TABLE 4

Values for spontaneous polarization ($P_s$) of selected compounds

| Material | Spontaneous polarization, $P_s$ (μC/cm²) |
|---|---|
| Bi$_{.5}$Na$_{.5}$TiO | 36 |
| KDP | 4.75 |
| KNO$_3$ | 6.3 |
| LiH$_3$(SeO$_3$)$_2$ | 15 |
| LiNbO$_3$ | 71 |
| LiTaO$_3$ | 50 |
| NaNbO$_3$ | 12 |
| PMN | 24 |
| PZN | 24 |
| PbTiO$_3$ | 75 |
| SbSI | 25 |
| YGeO$_2$N | 103 |
| YSiO$_2$N | 129 |

Figure 2A:
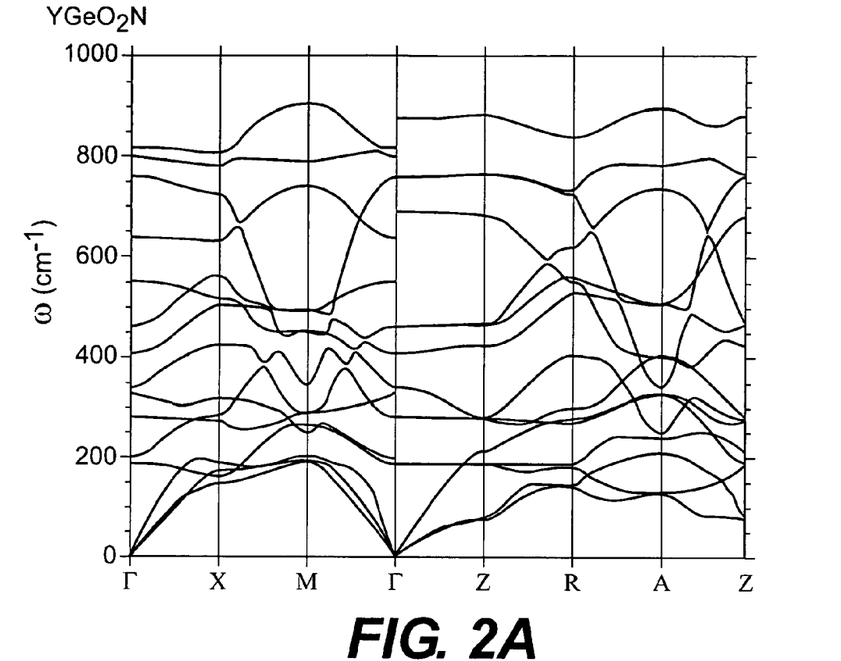
Figure 2B:
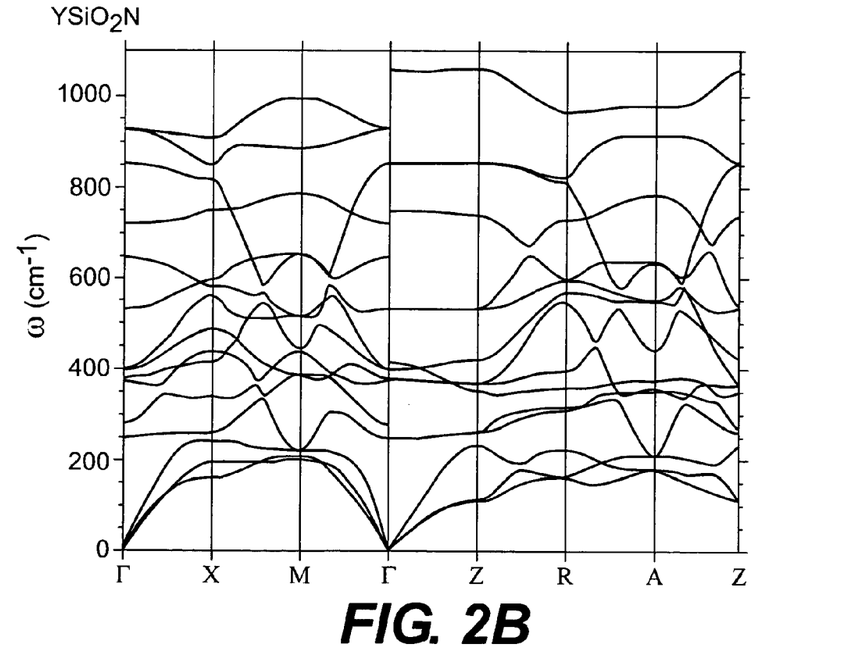

FIG. 2 shows the phonon band structures as computed in the density functional perturbation theory for YGeO$_2$N and YSiO$_2$N. YGeO$_2$N is shown in FIG. 2 A and YSiO$_2$N in FIG. 2 B. Surprisingly, both structures are dynamically stable. Both structures are dynamically stable. All optical modes are positive. The bands corresponding to octahedral rotations have similar dispersions to those observed in not ordered oxynitride perovskites. In particular, the positive phonon frequencies prove the (meta)stability of the structure. The elastic constants are all positive and listed in Table 5.

TABLE 5

Elastic Constants computed from linear response

| | C11 | C33 | C12 | C13 | C44 | C66 |
|---|---|---|---|---|---|---|
| YSiO$_2$N | 466 | 317 | 211 | 100 | 135 | 231 |
| YGeO$_2$N | 374 | 345 | 176 | 86 | 90 | 167 |

The zone-center modes and the Modes in gamma are shown in Table 6.

TABLE 6

Modes in Gamma for YGeO$_2$N and YSiO$_2$N

| Compound | | Modes in Gamma (cm$^{-1}$): | |
|---|---|---|---|
| YGeO$_2$N | A1 (z) | 328 | 342 |
| | | 553 | 692 |
| | | 819 | 879 |
| | B1 | 408 | |
| | E (x, y) | 188 | 200 |
| | | 282 | 340 |
| | | 462 | 640 |
| | | 761 | 801 |
| YSiO$_2$N | A1 (z) | 373 | 415 |
| | | 648 | 750 |
| | | 927 | 1058 |
| | B1 | 400 | |
| | E (x, y) | 249 | 281 |
| | | 380 | 402 |
| | | 534 | 721 |
| | | 854 | 930 |

4A$_1$ + B$_1$ + 5 E;
A$_1$, E are IR- and Raman active;
B$_1$ are Raman active

Figure 3:
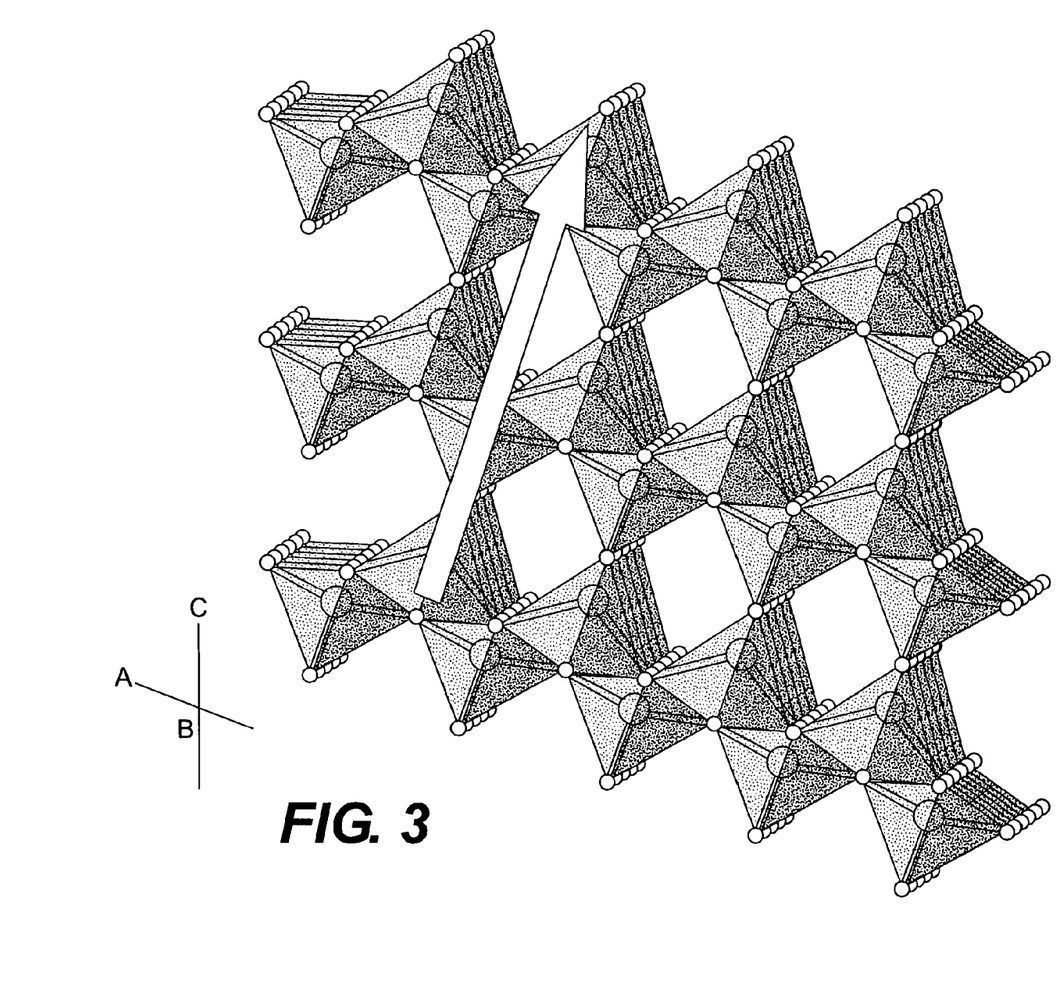
FIG. 3 shows the crystal structure of other oxynitride perovskites (e.g., $InTiO_2N$ and $BiZrO_2N$) according to the instant invention.

FIG. 3 shows the monoclinic crystal structure of other oxynitride perovskites (e.g., InTiO$_2$N and BiZrO$_2$N) according to the instant invention. In particular, InTiO$_2$N distinguishes by large values of the non-linear optical coefficients (see Table 7).

TABLE 7

Non-linear optical coefficients of InTiO$_2$N (in pm/V)

| −8.089 | −3.224 | 6.642 | 0.000 | 13.565 | 0.000 |
| 0.000 | 0.000 | 0.000 | 17.684 | 0.000 | −3.224 |
| 13.565 | 17.684 | −6.016 | 0.000 | 6.642 | 0.000 |

The lattice polarizations were calculated using modern theory of polarization (R. D. King-Smith and D. Vanderbilt, Phys. Rev. B 47, 1651 (1993); D. Vanderbilt and R. D. King-Smith, Phys. Rev. B 48, 4442 (1994); R. Resta, Rev. Mod. Phys. 66, 899 (1995)). The Berry's phase polarization is a lattice of values, with a lattice spacing of 2eR/Ω, where e is the electron charge and R are the lattice vectors. Polarization differences, however, are unambiguous. Experiments measure polarization changes (usually via hysteresis loops) and absolute polarizations are not measurable using standard methods. For ferroelectrics with small polarizations comparison between theory and experiment is straightforward, but in materials with large polarizations the lattice of polarizations measured for a single polar structure cannot be unambiguously reduced to an experimentally meaningful value, called the effective polarization, without additional computations (J. B. Neaton, C. Ederer, U. V. Wahmare, N. A. Spaldin, and K. M. Rabe, Phys. Rev. B 71, 014113 (2005); R. Resta and D. Vanderbilt, in *Physics of Ferroelectrics: A Modern Perspective*, edited by C. H. Ahn, K. M. Rabe and J. M. Triscone (Springer-Verlag, New York, 2007)). For tetragonal symmetry, only the z component of P is nonzero, the formal polarization value along the polar axis z as $P_{Berry}$=130 (±n308) μC/cm² for YSiO$_2$N and 103 (±n293) μC/cm² for YGeO$_2$N, where the polarization lattice spacing is indicated in parentheses, were obtained. As discussed in reference to Table 4, these values are extremely large compared to other compounds. In order to find the effective polarization, its value was computed using the Born effective charges, Z* (see Table 3) and the displacement vectors from the ideal perovskite structure u, ΔP=ΣZ*u. This gives effective polarizations Pz=−163 μC/cm² for YSiO$_2$N and Pz=−171 μC/cm² for YGeO$_2$N. These values are not identical to Berry's phase because of the linear approximation, but are very close. Using these values, the effective $P_{Berry}$ is estimated to be −178 μC/cm² for YSiO$_2$N and −190 μC/cm² for YGeO$_2$N. The direction of polarization is from the B ion toward the closer N. Born effective charges vary with distortion, the absolute values of the charges being slightly larger for the centrosymmetric phase than the ferroelectric phase.

Figure 4A:
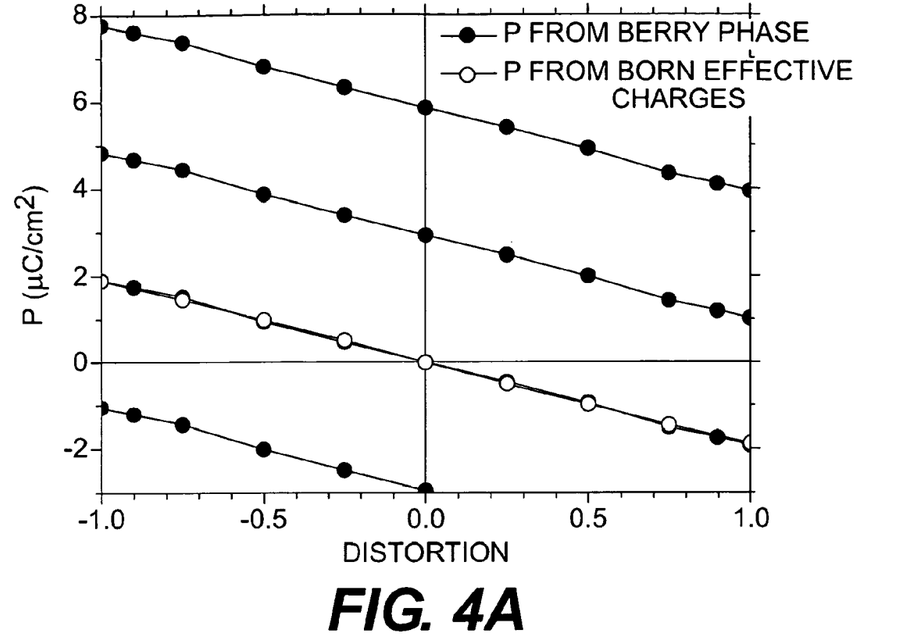
Figure 4B:
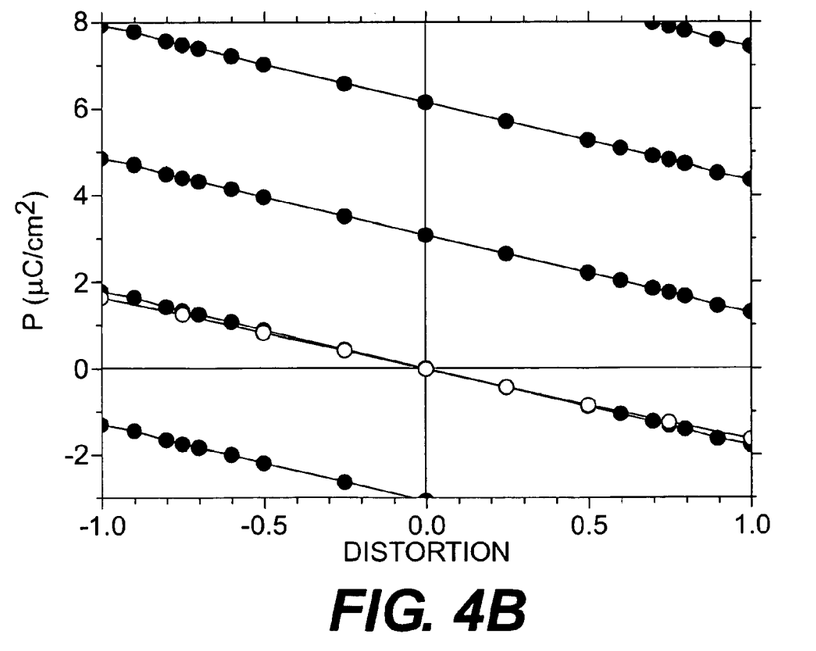

FIG. 4 shows the polarization of (a) YGeO$_2$N and (b) YSiO$_2$N versus polar distortion. This figure illustrates the computation of the effective polarization. The ground state structure is a distortion of 1 and the symmetric non-polar (unstable) structure is at 0. Multiple lines are shown because the polarization was computed for an idealized infinite perfect lattice, but the experimentally observable polarization is nevertheless unambiguous. The polarization was computed in two ways. It was computed directly using the modern Berry's phase approach from the electronic wavefunctions, and from $\Sigma u_i Z_i^*$, where $u_i$ is the displacement of each atom and $Z_i^*$ is the effective charge of each ion, computed theoretically. The two computations agree.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An oxynitride perovskite selected from the group consisting of $YGeO_2N$, $GaTiO_2N$, $InTiO_2N$, $BiZrO_2N$, $YCO_2N$, $BiTiO_2N$, $YTiO_2N$, $YZrO_2N$, and $YSnO_2N$
    wherein the oxynitride perovskite is ordered or partially ordered, polar and non-metallic.

2. The oxynitride perovskite of claim 1, wherein the oxynitride perovskite is dielectric.

3. The oxynitride perovskite of claim 1, wherein the oxynitride perovskite is a polar insulator.

4. The oxynitride perovskite of claim 1, wherein the oxynitride perovskite is piezoelectric.

5. The oxynitride perovskite of claim 1, wherein the oxynitride perovskite is ferroelectric.

6. A composition comprising an oxynitride perovskite of claim 1.

7. A crystal comprising an oxynitride perovskite of claim 1.

8. A composition comprising one or more crystals of claim 7.

9. A non-linear optic material comprising an oxynitride perovskite of claim 1.

10. A neutron generator comprising an oxynitride perovskite of claim 1.

* * * * *